(12) United States Patent
Buzz et al.

(10) Patent No.: US 10,296,665 B2
(45) Date of Patent: May 21, 2019

(54) IMAGE MANAGEMENT IN CONSTRUCTION PROJECT SOFTWARE PROGRAMS

(71) Applicant: On Center Software, Inc., The Woodlands, TX (US)

(72) Inventors: Leonard Buzz, Spring, TX (US); Angelo M. Castelli, Broadview Heights, OH (US); Ronnie Yates, The Woodlands, TX (US)

(73) Assignee: ON CENTER SOFTWARE, INC., The Woodlands, TX (US)

( * ) Notice: Subject to any disclaimer, the term of this patent is extended or adjusted under 35 U.S.C. 154(b) by 483 days.

(21) Appl. No.: 13/833,329

(22) Filed: Mar. 15, 2013

(65) Prior Publication Data

US 2014/0278267 A1   Sep. 18, 2014

(51) Int. Cl.
*G06F 17/50* (2006.01)
*G06Q 10/06* (2012.01)
*G06Q 50/08* (2012.01)

(52) U.S. Cl.
CPC ......... *G06F 17/5004* (2013.01); *G06Q 10/06* (2013.01); *G06Q 50/08* (2013.01)

(58) Field of Classification Search
None
See application file for complete search history.

(56) References Cited

U.S. PATENT DOCUMENTS

| 6,438,535 B1 * | 8/2002 | Benjamin | G06Q 10/10 |
| 6,523,024 B1 * | 2/2003 | Yajima | G06F 16/29 |
| 2002/0073114 A1 * | 6/2002 | Nicastro | G06Q 10/06 705/36 R |
| 2002/0154818 A1 * | 10/2002 | Najman | G06K 9/00449 382/199 |
| 2004/0117361 A1 * | 6/2004 | Greer et al. | 707/3 |
| 2005/0166149 A1 * | 7/2005 | Frigon | G06F 17/30274 715/712 |
| 2006/0085322 A1 * | 4/2006 | Crookshanks | G06Q 30/06 705/37 |
| 2007/0206863 A1 * | 9/2007 | Koyama | 382/218 |
| 2007/0288842 A1 * | 12/2007 | Averitt | G06F 17/5004 715/210 |

(Continued)

OTHER PUBLICATIONS

Figures, Sevigny (US 2013/0155009 A1), Filed Nov. 12, 2012.*

(Continued)

*Primary Examiner* — Saif A Alhija
*Assistant Examiner* — Bijan Mapar
(74) *Attorney, Agent, or Firm* — Snyder, Clark, Lesch & Chung, LLP

(57) ABSTRACT

A method and system for managing drawings in a construction project software program may include uploading drawings for a project in sets of drawings, collating the sets, determining if a drawing in a later set corresponds with a drawing in an earlier set, and creating and displaying a list of the uploaded drawings. The list includes a number of fields for each of the drawings in the list. The fields include a name for each drawing, a Sheet Number, and an issue date. If a drawing in a later set corresponds with a drawing in an earlier set, the list includes an indication that clearly shows such a correspondence and shows which set should be used for the latest version of such corresponding drawings.

22 Claims, 18 Drawing Sheets

(56) References Cited

U.S. PATENT DOCUMENTS

| | | | |
|---|---|---|---|
| 2008/0059220 A1* | 3/2008 | Roth | G06Q 10/10 |
| | | | 705/311 |
| 2008/0109327 A1* | 5/2008 | Mayle et al. | 705/27 |
| 2010/0077316 A1* | 3/2010 | Omansky | G06Q 10/10 |
| | | | 715/751 |
| 2013/0155009 A1* | 6/2013 | Sevigny | 345/174 |
| 2013/0155058 A1* | 6/2013 | Golparvar-Fard | G06T 19/006 |
| | | | 345/419 |
| 2014/0207774 A1* | 7/2014 | Walter | G06F 16/9577 |
| | | | 707/736 |
| 2014/0278271 A1* | 9/2014 | Stevenson | G06Q 10/10 |
| | | | 703/1 |

OTHER PUBLICATIONS

Lowell Heddings, How-to Geek, Get Vista Explorer Style Full Row Selection and Checkboxes in Windows XP, Dec. 19, 2008, retrieved from https://www.howtogeek.com/howto/windows/get-vista-explorer-style-full-row-selection-and-checkboxes-in-windows-xp/ (Year: 2008).*

* cited by examiner

IMAGE MANAGEMENT IN CONSTRUCTION PROJECT SOFTWARE PROGRAMS

TECHNICAL FIELD

The present invention relates to management of construction projects, and in particular to techniques for managing drawings in a construction project software program.

BACKGROUND

Construction professionals generally use computer software programs to provide pricing for and manage the construction of large construction projects. Some of these construction software programs include capabilities for drawing or uploading construction plans and/or architectural drawings. The software programs may enable a user to enter a list of building conditions that are required to be completed for a given construction project. The term building condition refers to each separate component of the construction project that needs to be built or installed. For example, the ceiling, exterior structure, doors, or a particular type of wall are all considered building conditions. As building conditions are entered, a user can create live objects on the construction drawings, where the live objects are linked to and represent particular building conditions. This process is sometimes referred to as takeoff. Once takeoff of building conditions is complete, the resulting software file would quantify building conditions and could be used to calculate a projected cost for the entire project and thus help create a bid for it. Such a file can also be used to track and manage the project once a bid is accepted and work on the project begins.

Often one of the first steps in creating a project in a construction software program is to upload architectural drawing or images that have already been created by an architect for the project. Large construction projects generally include tens of pages of drawings. Managing these pages of drawings is a cumbersome task. This task is made even more difficult because of constant changes that can be made to the drawings. Sometimes during the bidding process or after a bid has been accepted, an owner or project manager requests changes. For example, the size of a room may need to change, more rooms may need to be added, or the size of a window or the height of a ceiling portion may need to change.

These architectural changes generally result in revised versions of the original drawings, thus creating multiple versions of drawings. Keeping track of the various versions of the drawings, the differences between them and which drawing is the latest version in a group of corresponding drawings is essential to proper management of a construction project. However, as a project's size and complexity increases, keeping track of the various versions of the drawings becomes increasingly more difficult.

Thus, it would be desirable to implement an efficient method for management and viewing of drawings in a construction project software program.

SUMMARY

A method and system for managing drawings in a construction project software program may include uploading drawings for a project in sets of drawings, collating the sets, determining if a drawing in a later set corresponds with a drawing in an earlier set, and creating and displaying a list of the uploaded drawings. The list includes a number of fields for each of the drawings in the list. The fields include a name for each drawing, a Sheet Number, and an issue date. If a drawing in a later set corresponds with a drawing in an earlier set, the list includes an indication that clearly shows such a correspondence and shows which set contains the latest version of such corresponding drawings. When a user selects a drawing from one set to view, if there is a corresponding drawing in a different set, the method presents the correspondence with the displayed drawing such that the user is notified that the drawing has different versions.

BRIEF DESCRIPTIONS OF THE DRAWINGS

DETAILED DESCRIPTIONS

Figure 1:
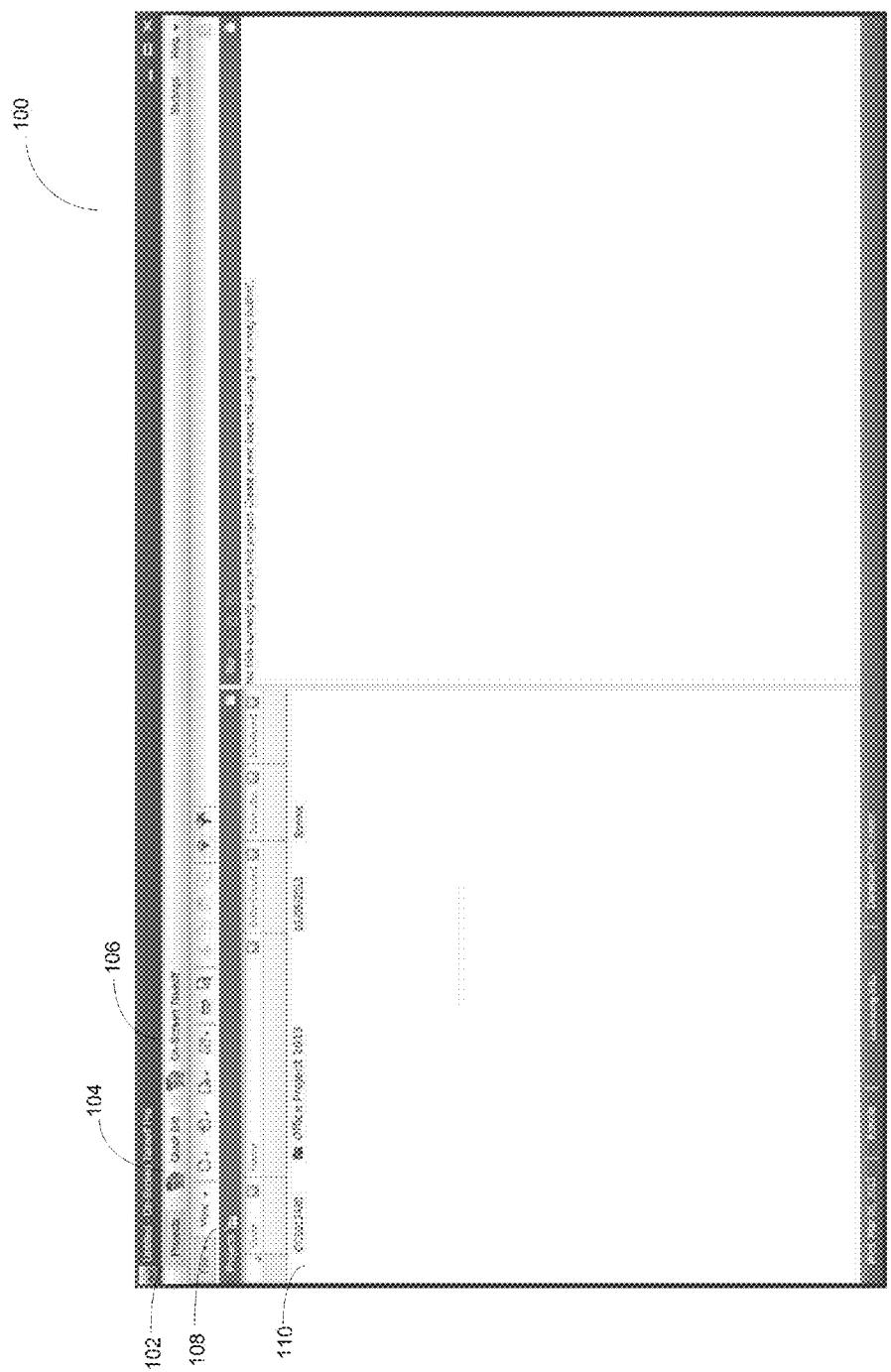
FIG. 1 is a diagram illustrating an exemplary user interface screen for a construction software program, according to one embodiment.

FIG. 1 illustrates a user interface screen 100 of one embodiment of the construction project software program of the present invention. The user interface screen 100 includes various buttons and tabs that provide a variety of options for processing and viewing construction project related information. For example, the screen 100 includes a button 102 for choosing to view a list of active projects, a button 104 to go to the Quick Bid® feature of the program, and a button 106 for going to an On-Screen Takeoff® screen where the takeoff process can be performed. The view pane no of the screen 100 provides a list of projects available for viewing and processing.

Figure 2:
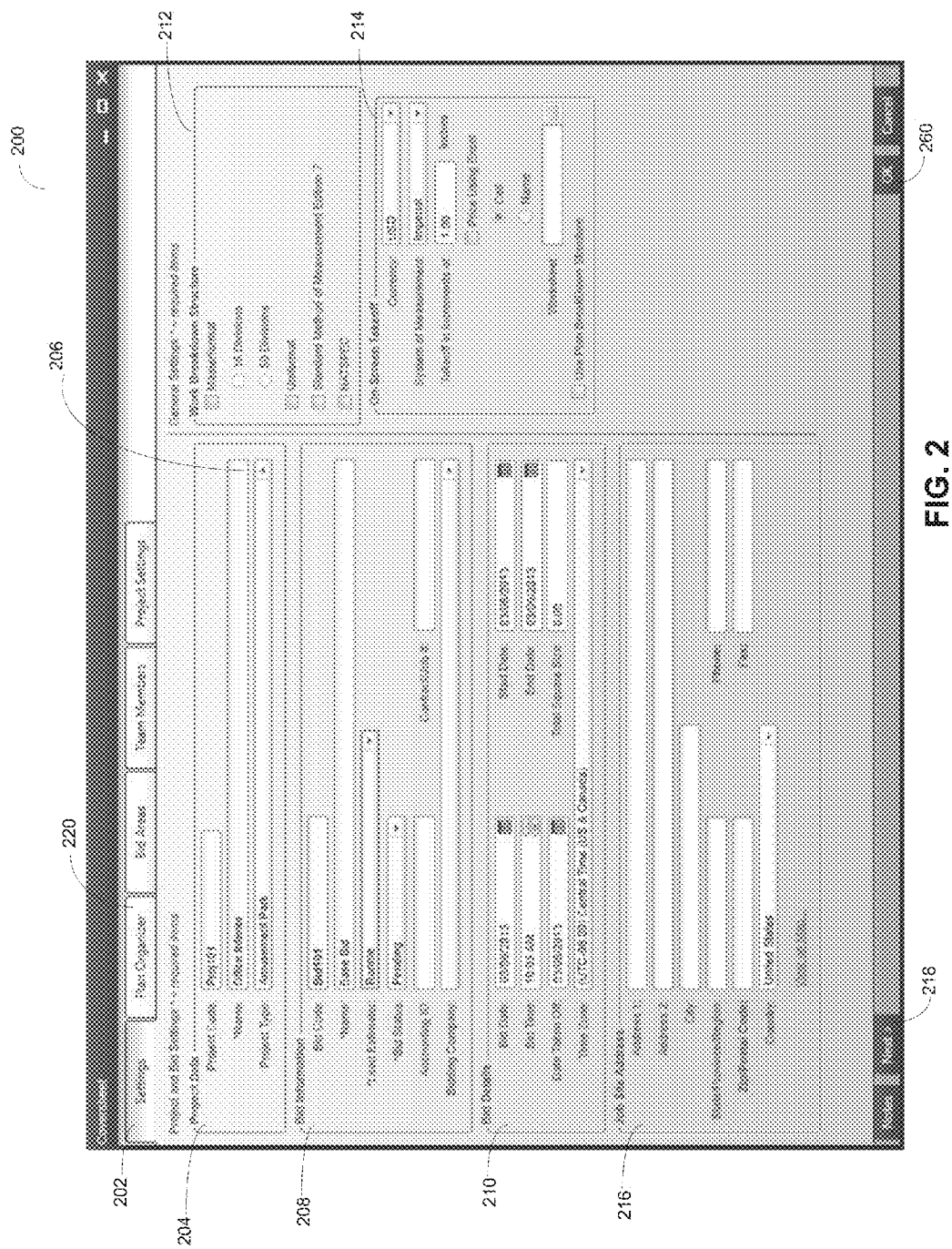
FIG. 2 is a diagram illustrating an exemplary user interface screen for a construction software program showing settings for a new project, according to one embodiment.

The projects icon 108 of screen 100 allows the user to add additional projects to the program. Upon clicking on the icon 108, the user is taken to the settings tab 202 of Coversheet screen 200 of FIG. 2. This settings tab 202 includes various input boxes and checkboxes that enable the user to enter information for a new construction project. As illustrated, a Project Data section 204 enables the user to enter a project code and project name, and to either select a project type from the drop down menu 206 or enter a new project type if the desired project type is not available in the drop down menu 206. The Bid Information section 208 provides the user with the ability to enter information about the bid, such as a bid code, bid name, accounting ID, and the like, and to either select or enter information about the lead estimator for the bid and the bid status. The Bid Details section 210 provides options for entering or selecting detailed information about the bid, such as, the bid date, bid time, start date, end date, and the like. The Job Site Address section 216 is provided such that the user can enter address information about the potential site of the construction project. The Screen 200 also includes a Work Breakdown Structure 212 and an On-Screen Takeoff section 114 for selecting options for plan breakdown structure and for On-Screen Takeoff. Once information has been entered or selected in the various sections of screen 200, the user can click on the Next button 218 or the OK button 260 to create the new project. Alternatively, the user can click on the Plan Organizer tab 222 to be taken to the Plan Organizer tab where the user can upload drawings. The term uploading refers to sending data from one portion of a computing system (e.g., one portion of memory) to another portion, or from one computing system to another. Uploading a file may also refer to creating a shortcut to the file from the construction project software program.

Figure 3A:
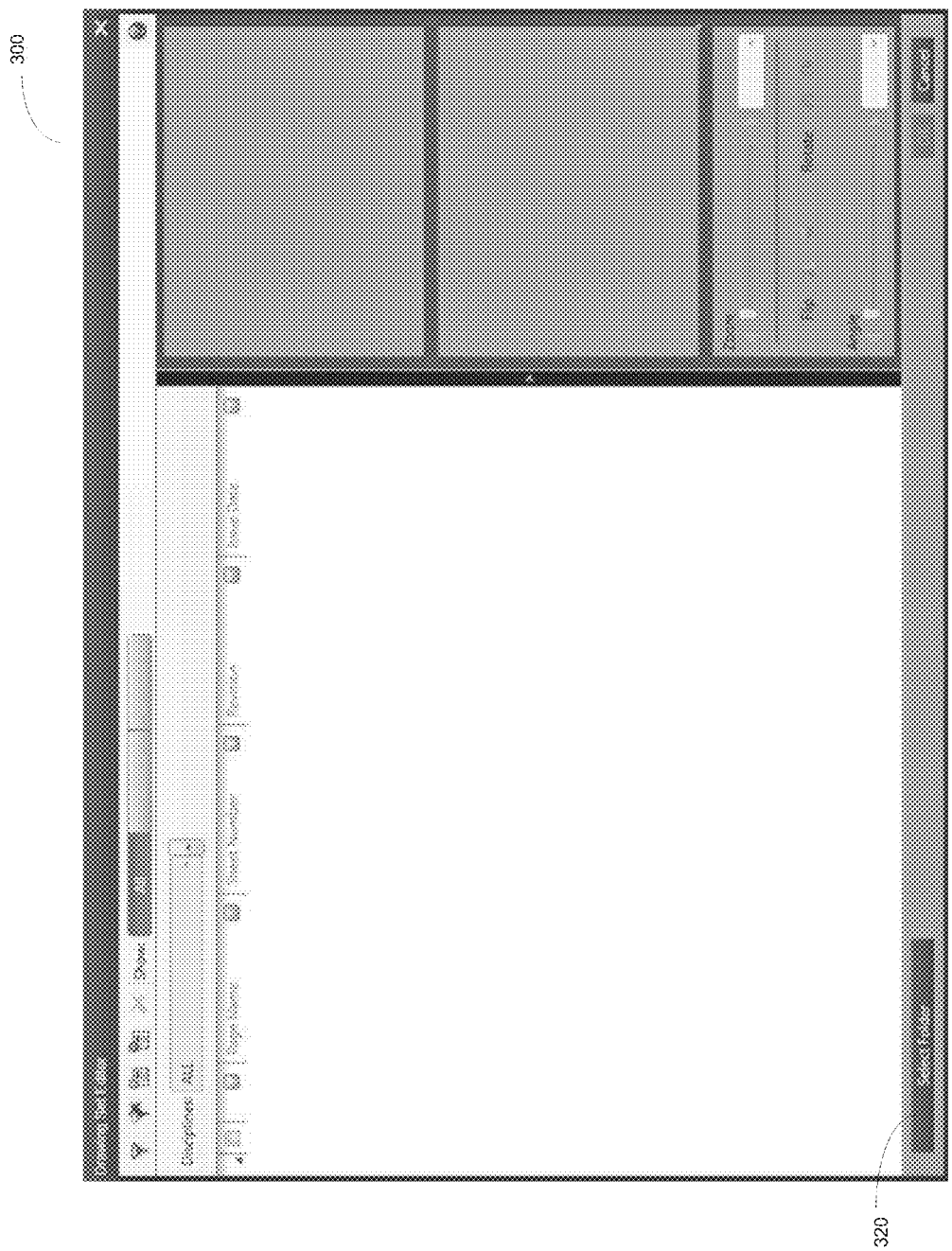
FIGS. 3A-3D are diagrams illustrating exemplary user interface screens for a construction software program for selecting drawings to upload, viewing and modifying a list of those drawings, according to one embodiment.
Figure 3B:
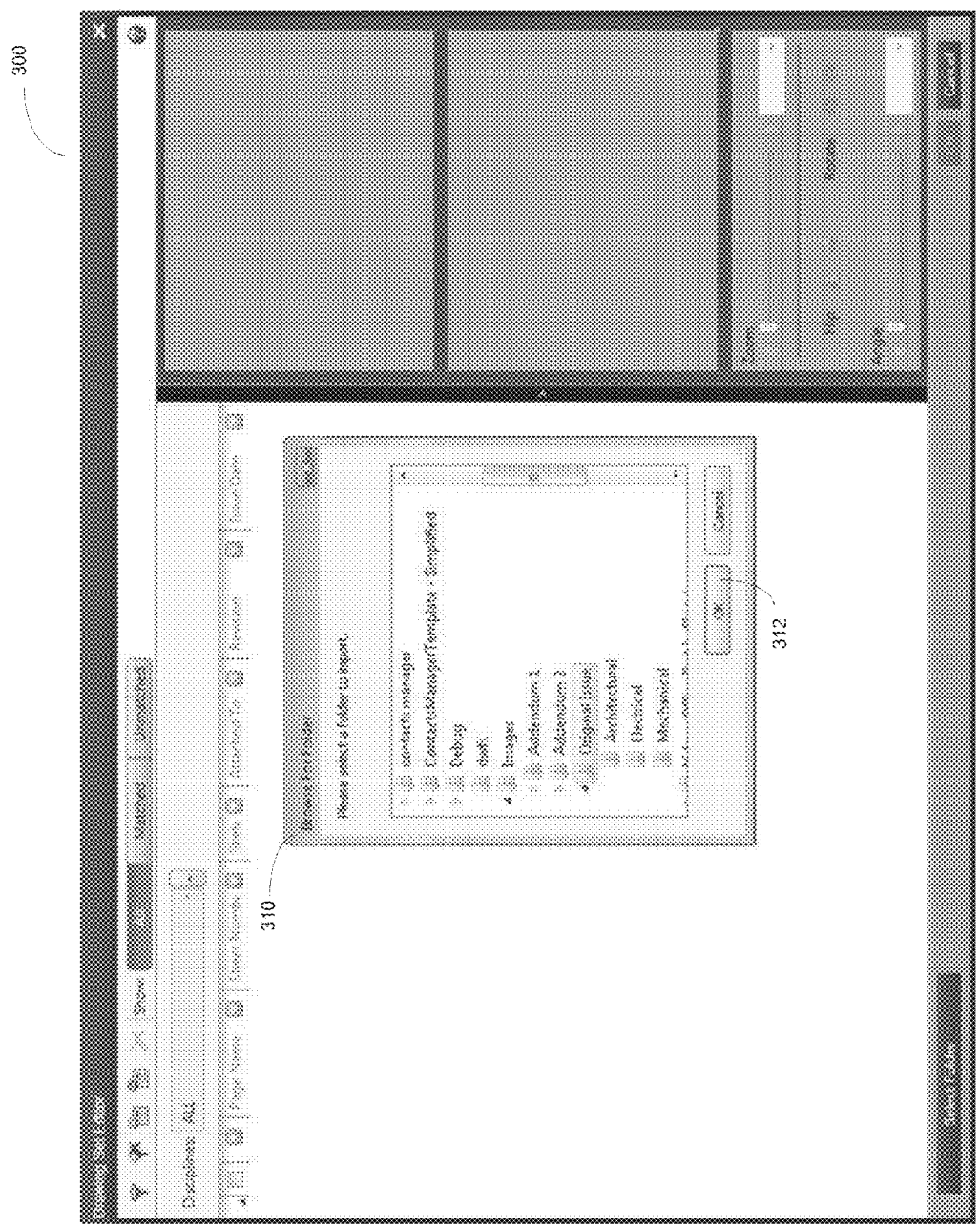

By clicking on the Next button 218, the OK button 260 or the tab 222 the user is taken to the Drawing Set Editor screen 300 of FIG. 3A. The screen 300 illustrates a Drawing Set Editor screen when a project is first being created and no drawings have been uploaded for the project. The screen 300 provides a button 320 for selecting a folder. Clicking on the Select Folder button 320 brings up the popup screen 310 of FIG. 3B which allows the user to browse to folders stored on the computing device and select a folder in which drawings for the project are stored. In the embodiment illustrated in FIG. 3B, the Folder named "Original Issue" is selected. As shown, the Original Issue folder includes three subfolders named "Architectural", "Electrical" and "Mechanical." After a folder is selected and the OK button 312 is pressed, the program starts the process of uploading all of the drawings in the selected folder, including all drawings of the subfolders under the selected folder. The subfolder names are copied as disciplines to a list of disciplines for the project, and the uploaded drawings are tagged and categorized by a discipline corresponding to the subfolder from which they were uploaded. The program then creates a table of information relating to the uploaded drawings. Such a table is displayed in FIG. 3C. The table 330 includes a number of fields, where each field relates to one category of information about the drawings. For example, the fields include discipline, page name, sheet number, revision and issue date.

After drawings are selected for uploading, the program automatically populates the table 330 based on information derived from the folder and file names of each drawing. This populating is done by examining information regarding industry standards and conventional ways of organizing and releasing drawings. This information is used to automatically organize the drawings for efficient management of drawings in a construction project. For example, the inventors have found that architects generally organize and release their drawings by separating the drawings by discipline and placing drawings belonging to each discipline in a separate subfolder named after the discipline. To be consistent with industry standards, the table 330 is also organized by discipline. The discipline categories are derived from the subfolder names in the selected folder. In the example illustrated in FIG. 3C, the subfolders include Mechanical, Electrical, and Architectural. Each of those disciplines is used as a heading category in the table 300 (headings 332, 334 and 336) and drawings belonging to each discipline are displayed under the particular heading. For example, drawing 340 was originally stored in the subfolder "Architectural." As a result, it is now listed under the Architectural discipline heading 336. Although the program automatically organizes the uploaded drawings by discipline, in particular instances, the subfolder names may not be the correct disciplines for a drawing. For such cases, the program allows the user to select a drawing by selecting the check box provided for each drawing in the list and clicking on the drop down menu 342 to select a different discipline. The list of disciplines under the drop down menu 342 is automatically created from the subfolder names. However, in one embodiment, the user can edit the list by adding or removing items from the disciplines list.

The table 330 includes a column 344 for the Page Name associated with each drawing. The page name is derived from the file name of the drawing and in the preferred embodiment cannot be changed. In alternative embodiments, the page name can be changed by the user. In one alternative embodiment, the user can select two or more rows and change the pages names in groups. The table 330 also includes a column 346 for the sheet number associated with each drawing. The sheet number is generally a unique number printed on each page of the drawing which is used in the industry to identify, organize and align drawings. In the preferred embodiment of the present invention, the sheet number is automatically derived from the page name. This is done by using an algorithm that relies on rules based on naming conventions used in the industry. For example, the algorithm examines the page name of drawing 340 which is "0001_A1.01" and automatically determines that the sheet number is the last four characters of that page name. The algorithm is based on naming conventions in the industry. Because these conventions may not always be followed, the program allows the user to enter a different sheet number or select one from a drop down menu.

Figure 3C:
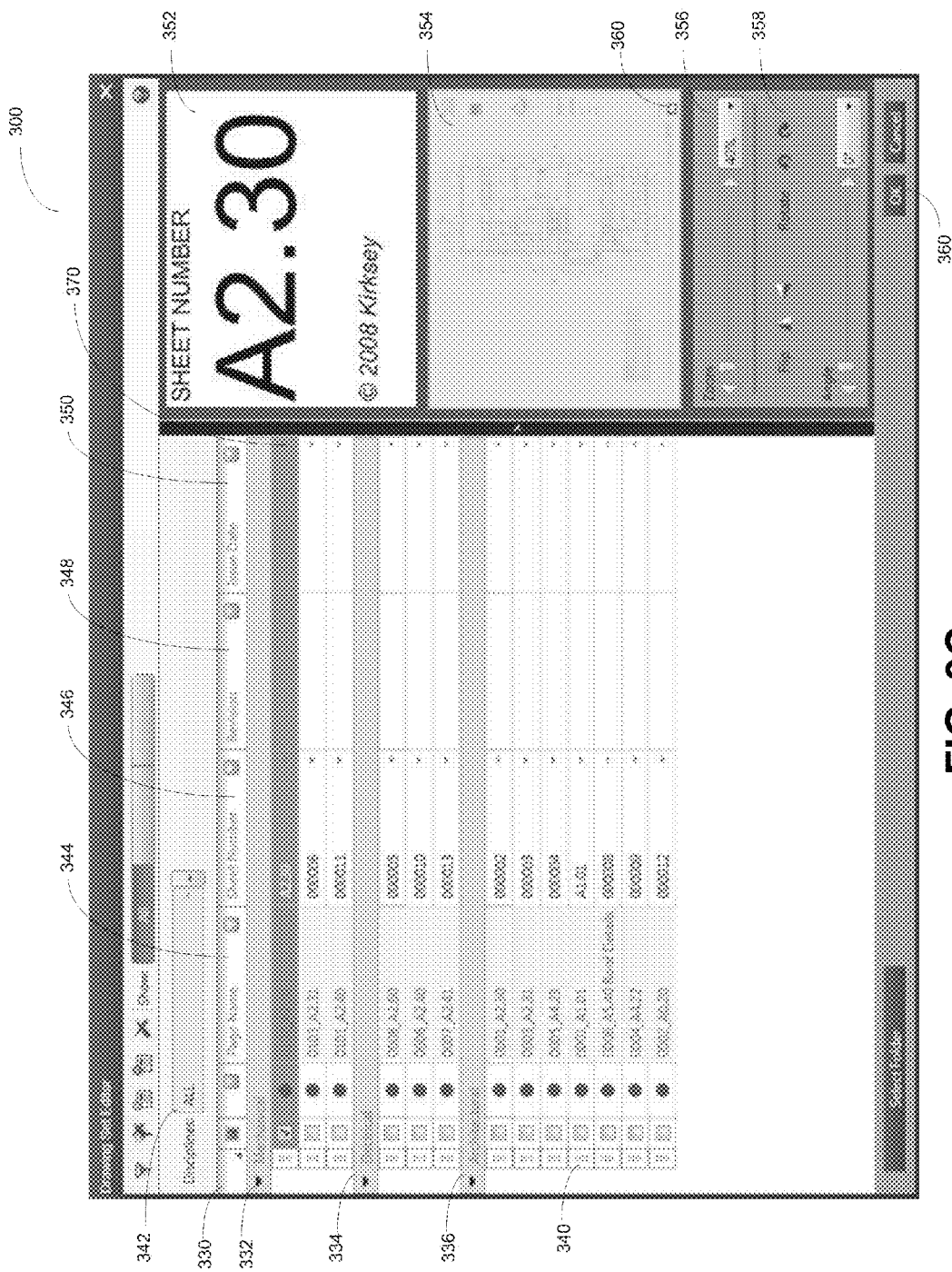

The program also enables the user to verify and correct the sheet number for each drawing by providing the image preview 352 and the thumbnail 354. The thumbnail 354 provides a thumbnail of a selected drawing. Thus, after selecting a drawing in the table 330, the user can view a thumbnail of the drawing in the thumbnail 354. The image preview 352 allows the user to zoom into the thumbnail 354 using the zoom frame 360. The zoom frame 360 is a visual indicator representing the area appearing in the image preview 352. By moving the zoom frame 360 in the thumbnail 354, the user can zoom into various portions of the drawing and view the zoomed-in picture in the image preview 352. The zoom slider 356 enables the user to select how much to zoom in to the drawing. The image setting options provided in portion 358 allow the user to flip, rotate or change the angle of the drawing as it is uploaded in the program. This allows the user to view and change the orientation or viewing format of the drawing in the image preview 352 such that the user can zoom into particular portions of the drawing and locate the sheet number on the drawing. This is illustrated in FIG. 3C where the image preview 352 shows the Sheet Number A2.30 for the selected drawing. By locating the sheet number on the actual drawing, the user is able to verify that the sheet number displayed in the table 330 is correct and change it if it is not.

The image preview 352 and the viewing options provided can also be used to view the issue date printed on the drawing. The issue date is generally the date the architect issues a drawing and is normally printed on each page of the drawing. Alternatively, the issue date can be looked up by the user in the image preview 352 and input in the column 350 for each drawing. The issue dates entered by the user populate the drop down menu 370 such that after one issue date has been entered, the user does not need to manually input that issue date anymore. Instead, the user can select that issue date from the drop down menu 370. The table 330 also includes a column Revision 348 which will be discussed below. Once the information in the table 330 has been reviewed and verified, the user clicks on the OK button 360 to upload and store the drawings in the program.

Figure 3D:
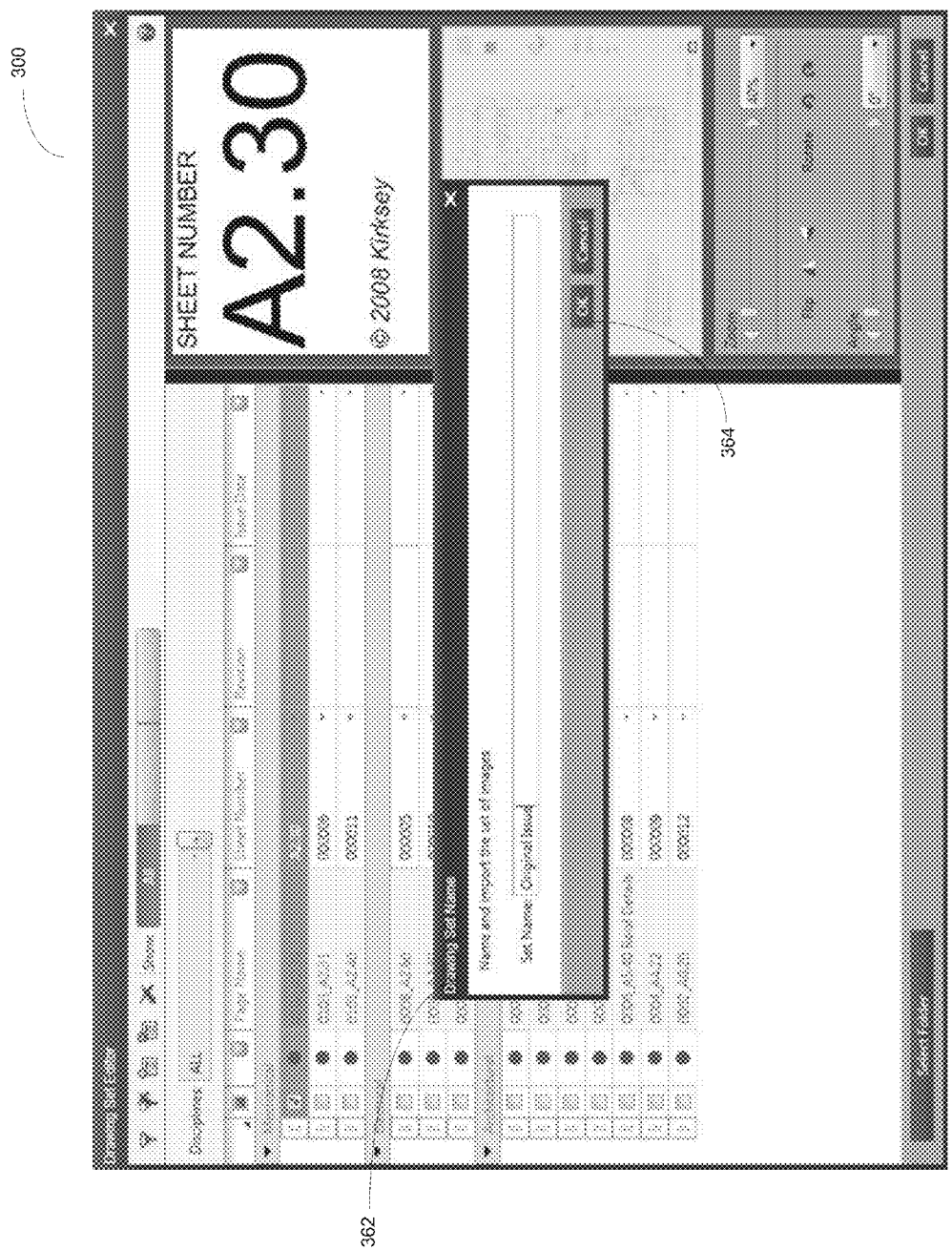
Figure 4:
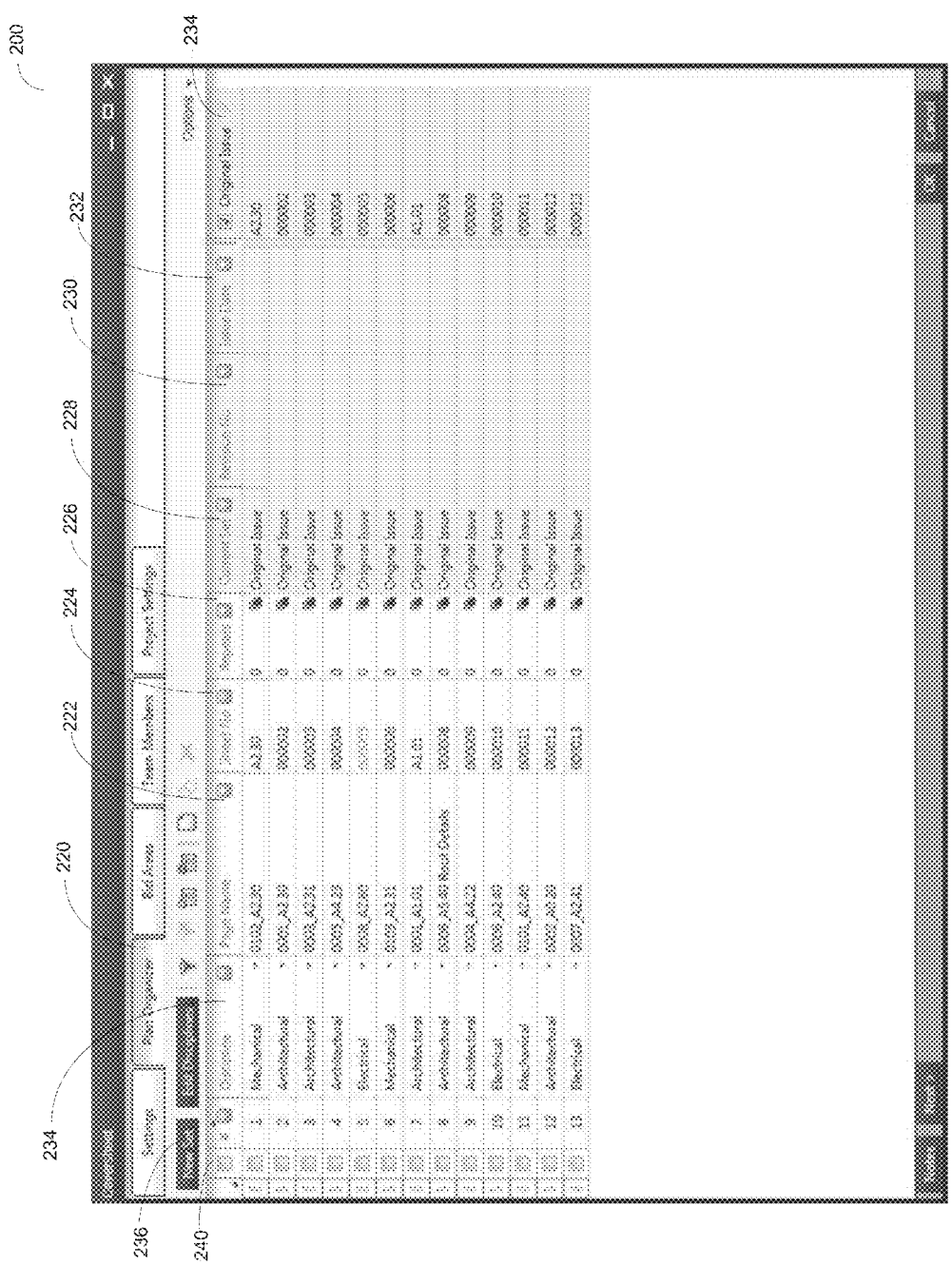
FIG. 4 is a diagram illustrating an exemplary user interface screen showing a list of uploaded drawings, according to one embodiment.

Upon clicking on the OK button 360, the program brings up the Drawing Set Name screen 362 of FIG. 3D. The Drawing Set Name screen 362 allows the user to enter a name for the set of drawings that are being uploaded. In the example provided, the user names this set "Original Issue." Clicking on the OK button 364 takes the user to the Plan Organizer tab 220 of the Coversheet 200 illustrated in FIG. 4.

The Plan Organizer 220 displays a list of the drawings uploaded in the program. The list is organized and displayed in the table 240 which includes a column 234 for Discipline, a column 222 for Page Name, and a column 224 for Sheet Number. Table 240 also includes a column 226 for Repeats which displays the number of virtual pages created for that drawing. The Current Set column 228 shows the set to which the latest version of each drawing belongs. In the table 240, because only one set of drawings has been uploaded, the column 228 only displays "Original Issue" as the Current Set. The Revision No. column 230 displays the revision number of the drawing obtained by the user in the previous image previewing option and the Issue Date column 232 displays the issue date for each drawing. In this manner, the Plan Organizer tab 220 provides a summary overview of the drawings in the project on one screen.

Often times during the bidding process of a construction project or even after a bid has been accepted and project started, changes need to be made to the construction drawings. Architects often make these changes by revising particular drawing pages and releasing a new set of drawings which generally only includes the revised pages. In complex construction projects which may include hundreds of pages of drawings, determining which drawings in a project have been revised, what the differences between the various revisions are, and which drawing in each set is the final version can be cumbersome and confusing. Construction project professionals generally have to keep track of all the changes and revisions manually. This can lead to many potential errors. The software program of the present invention provides an efficient and easy mechanism for viewing and managing multiple versions of drawings. This management process can be started by clicking on the New Set button 236 of the Plan Organizer tab 220. The New Set button 236 enables the user to upload a new set of drawings after an original set has been uploaded.

Figure 5A:
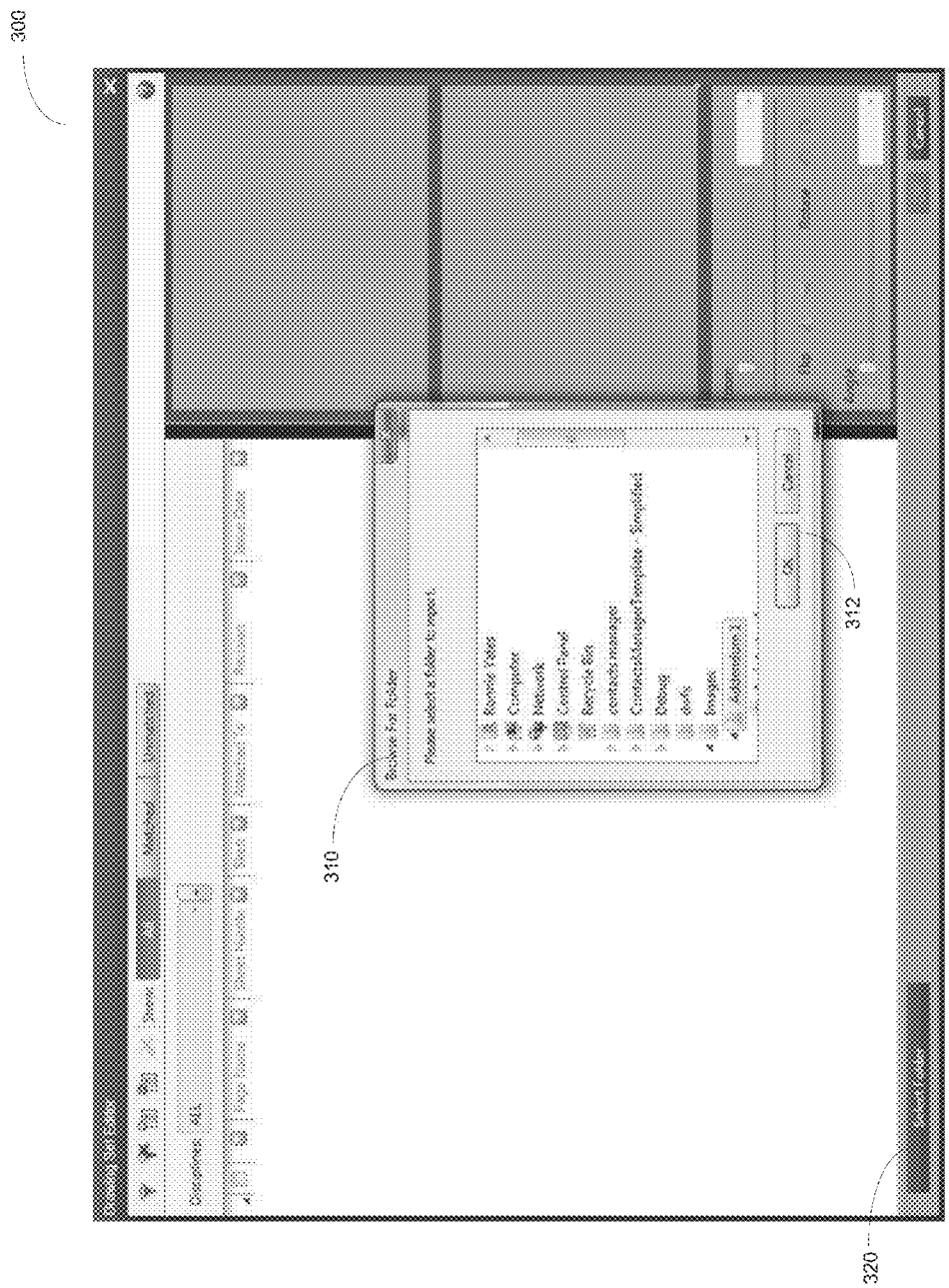
FIGS. 5A-5C are diagrams illustrating exemplary user interface screens for a construction software program for selecting additional drawings to upload, and viewing and modifying lists of those drawings, according to one embodiment.

Clicking on the New Set button 236 takes the user to the Drawing Set Editor screen 300 shown in FIG. 5A. Once there, the user can click on the Select Folder Button 320 to be presented once again with the Browse For Folder popup screen 310. In the example shown in FIG. 5A, this time, the user selects the Folder named "Addendum 1" to upload drawings that have been released as part of an Addendum 1 set of drawings. Clicking on the OK button 312 then takes the user to screen 300 of FIG. 5B where the user is presented with a list of drawings in the Addendum 1 folder. As shown, the Addendum 1 folder only includes one drawing 502. As discussed before, the program includes an algorithm for identifying the Sheet Number from the Page Name of a drawing. In this case, the Sheet Number "A1.01" is automatically determined from the Page Name "0002_A1.01." The Sheet Number is then verified by the user in the image preview 352 and changed if it is incorrect. When prior sets of drawings are present, upon uploading additional sets of drawings or when a Sheet Number for a drawing in a new set is changed, the program checks to see if the new Sheet Number matches any of the previous sheet numbers. If there is a match, the drawings that match with each other are recognized as corresponding with each other and are tagged as such by the program. A list of the matching drawings can then be viewed by clicking on the Matched button 504, and a list of the unmatched drawings can be seen by clicking on the Unmatched button 506. In alternative embodiments, other fields are used for matching the drawings.

Figure 5B:
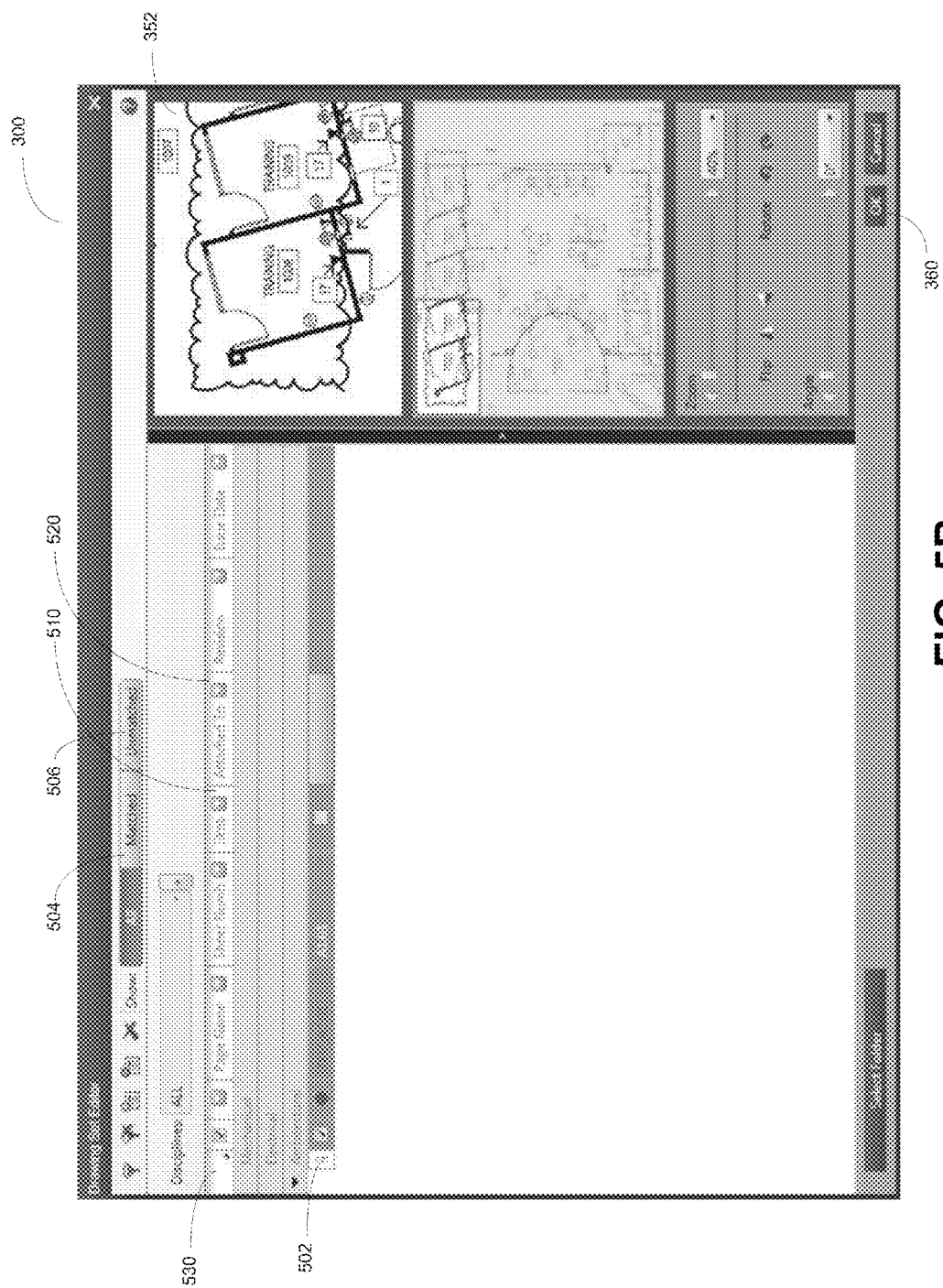

Table 530 of FIG. 5B also includes a Sketch column 510 and an Attached To Column 520. These columns are utilized when there are images in the drawing sets that are not considered full drawings. This generally occurs when the architect includes a sketch in the drawing set which is used as an attachment to a full drawing. The Sketch column 510 enables the user to mark the drawing as a sketch. The Attached To column 520 then allows the user to select a drawing from the drop down menu to attach the sketch to. Once the user verifies or changes the information displayed in the table 530, the user can click on the OK button 360 to once again be taken to the Drawing Set Name screen 362, shown in FIG. 5C. In the example embodiment illustrated, the user enters the set name as Addendum 1, since this is the first addendum set of drawings. Once the name is entered, the user can click on the OK button to be taken again to the Plan Organizer tab 220 shown in FIG. 6.

At this point, the Plan Organizer tab 220 lists both the original set of drawings and the first revised set. To clearly show that there are two different sets of drawings, the Plan Organizer tab 220 includes a column 238 to the table 240 for the new set. The Column 238 is labeled the same as the name entered in the Drawing Set Name screen 362 ("Addendum 1") and displays a list of drawings included in the new set. Because the only drawing included in Addendum 1 had a sheet name of A1.01 which corresponds to a drawing in the original set, the new drawing is matched with the A1.01 drawing of the original set and listed in the table 240 in the same row as the original drawing A1.01. Additionally, the Current Set column 228 lists "Addendum 1" as the set which contains the latest version of the A1.01 drawing. In this manner, the Plan Organizer screen illustrates how drawings in multiple sets correspond with each other, showing a history of the revisions, displaying which set is the latest set and showing revision trends on one screen. This feature is very helpful for construction professionals in managing and keeping track of their many construction drawings quickly and accurately.

Figure 5C:
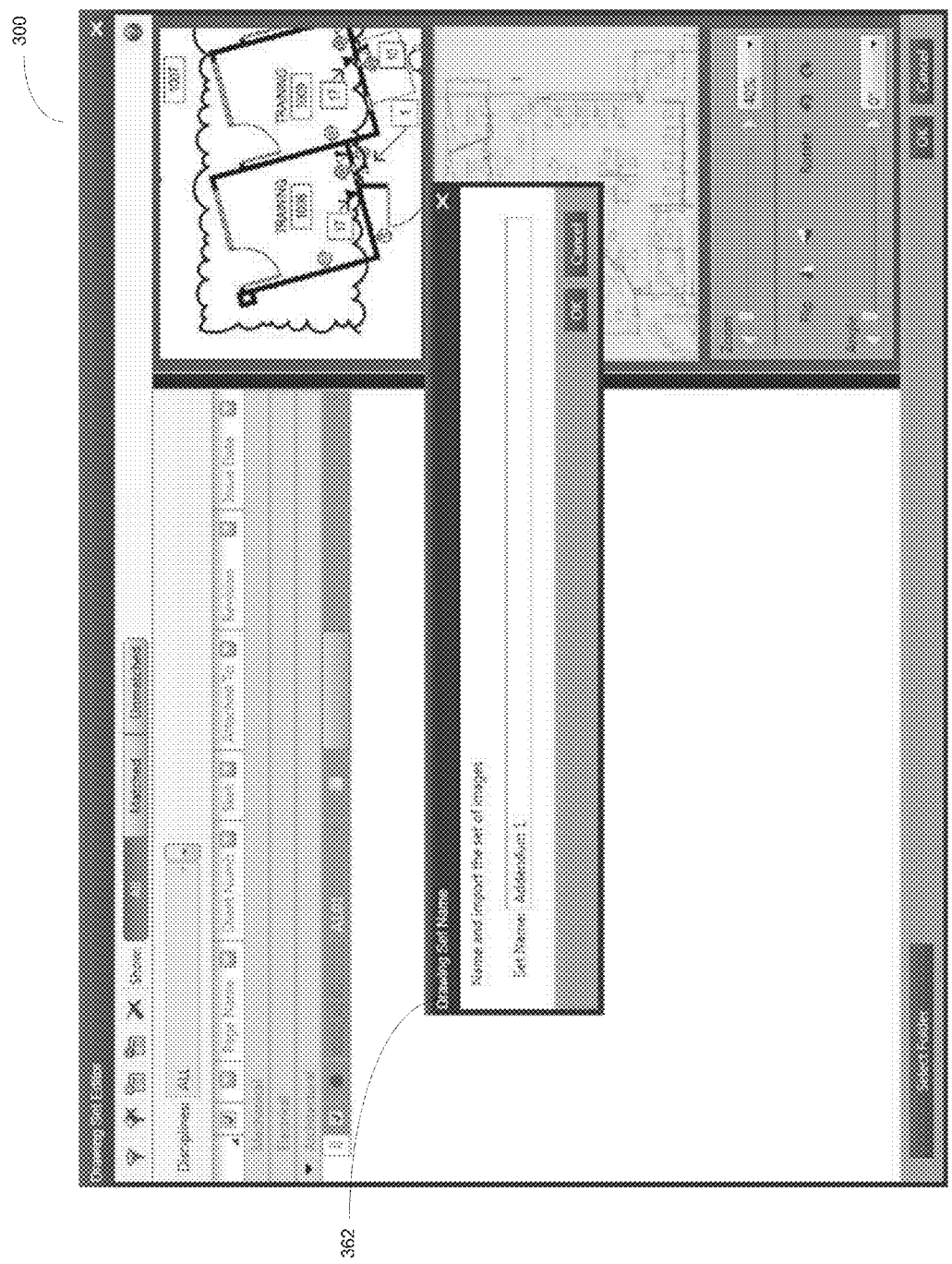
Figure 6:
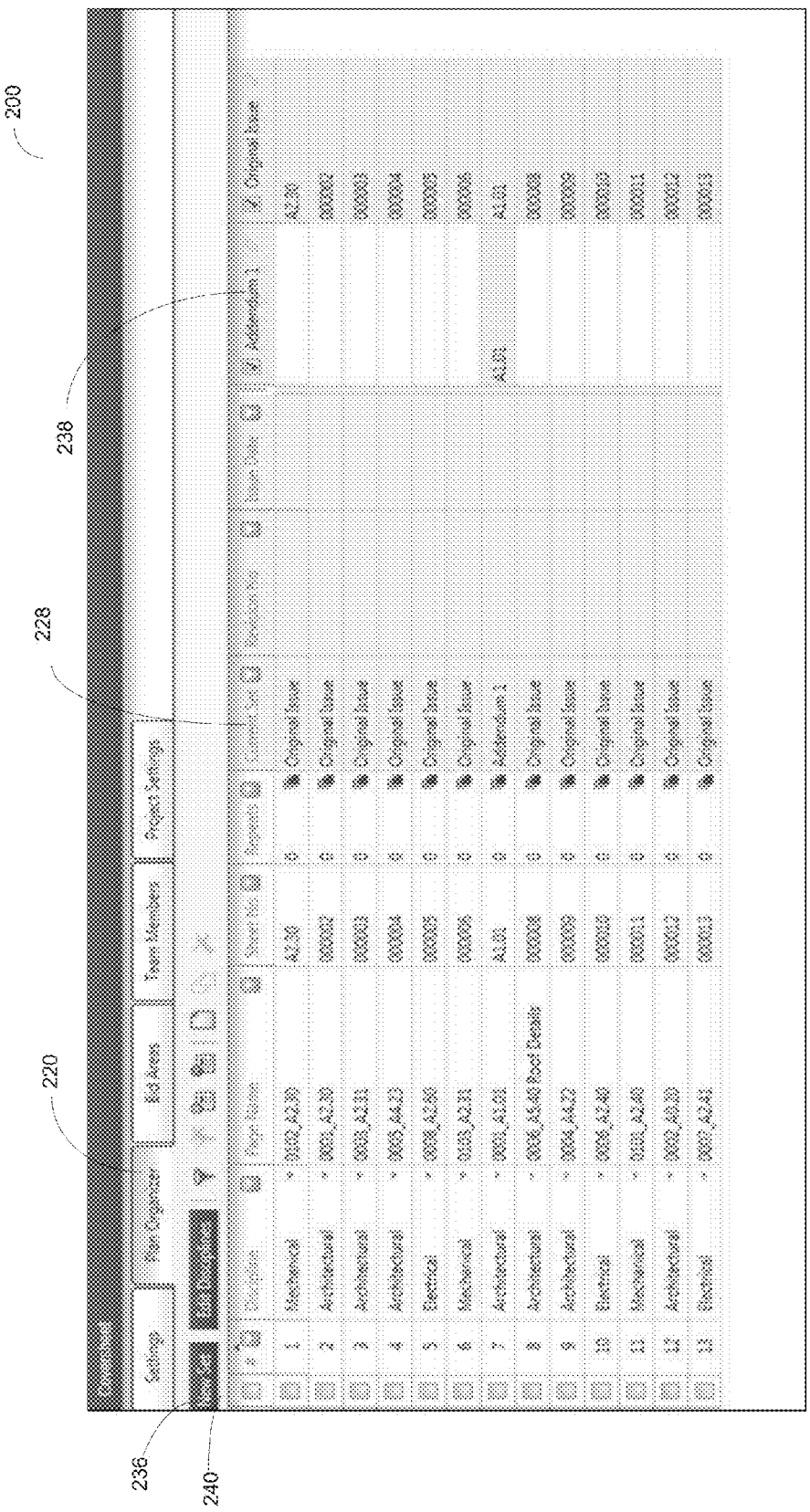
FIG. 6 is a diagram illustrating an exemplary user interface screen showing a list of uploaded drawings, according to one embodiment.
Figure 7A:
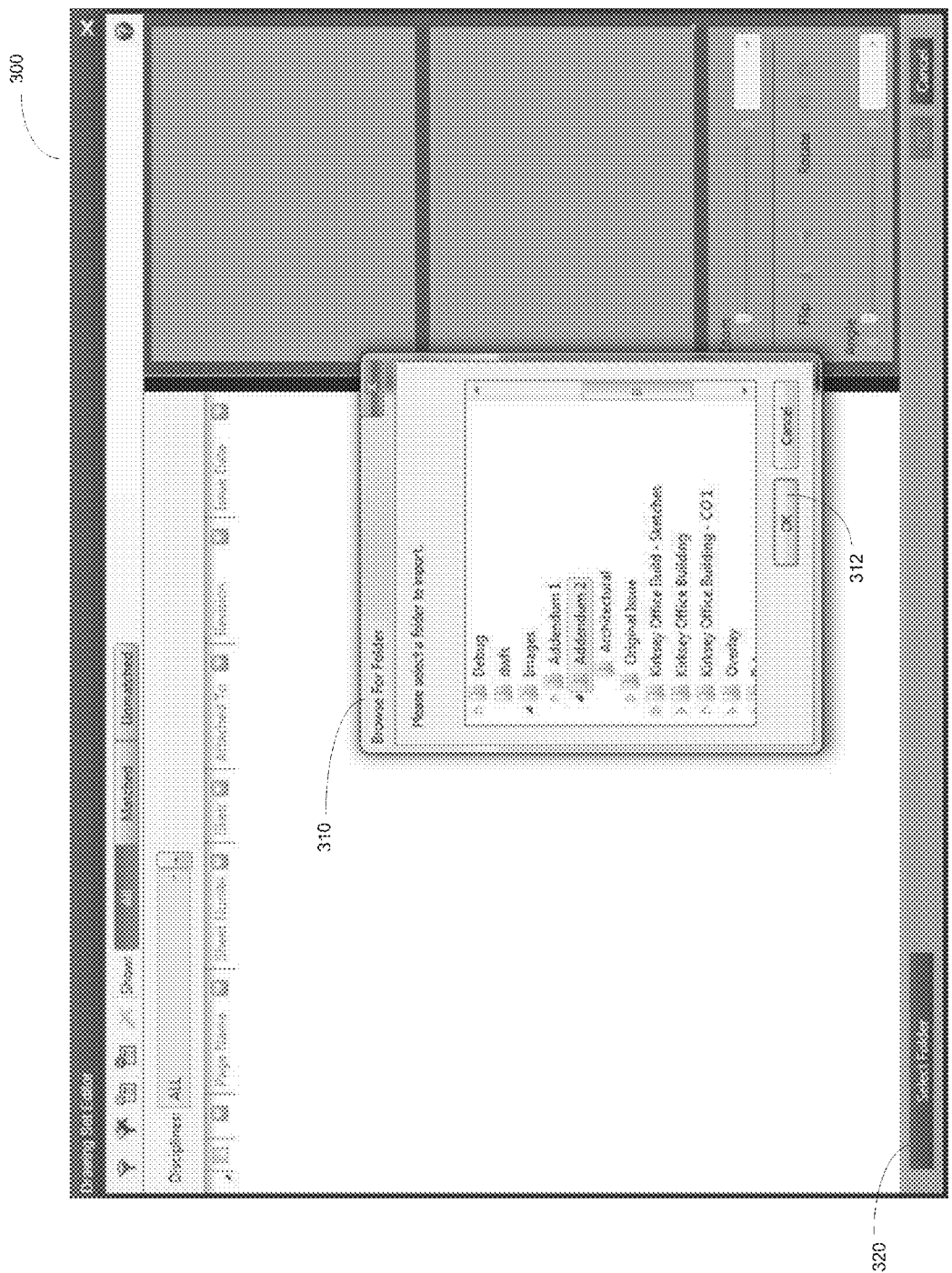
FIGS. 7A-7B are diagrams illustrating exemplary user interface screens for a construction software program for selecting additional drawings to upload, and viewing and modifying lists of those drawings, according to one embodiment.
Figure 7B:
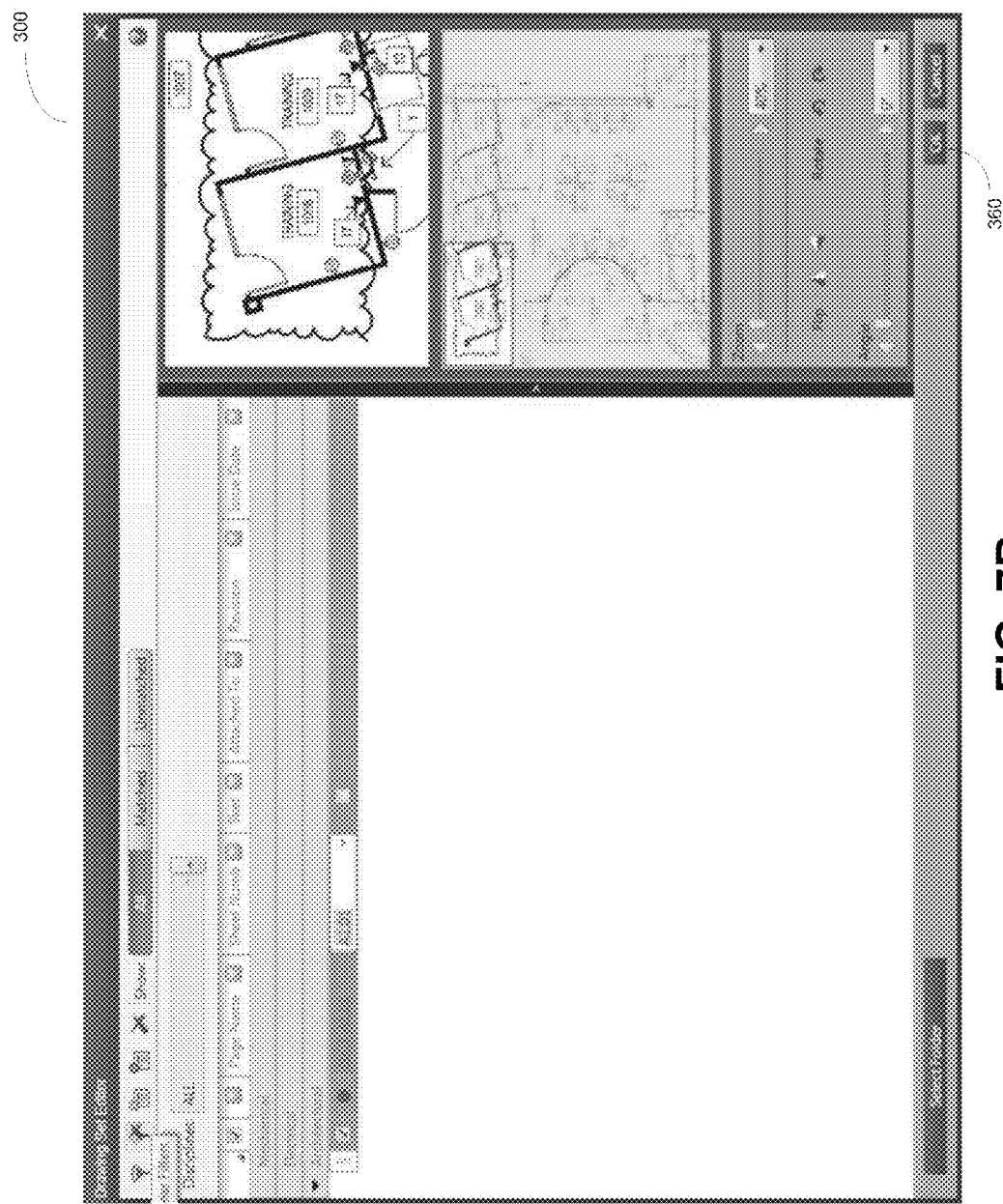

If after adding the "Addendum 1" set of drawings, the user decides to add more sets, he/she can do so by clicking on the New Set button 236 which takes the user to the Drawing Set Editor screen 300 shown in FIG. 7A, in which after clicking on the Select Folder button 320 and being presented with the Browse For Folder screen 310, the user has selected "Addendum 2" as the folder containing the new set of drawings. At this point, the user can click on the OK button 312 to be taken to the screen 300 of FIG. 7B which illustrates one new drawing from the new set being added to the list of drawings. As illustrated, the Addendum 2 set includes a drawing 0003_A1.01 under the Architectural discipline. After verifying and/or changing the sheet number associated with the new drawing, the user can once again click on the OK button 360 to enter a name for the new set (not shown, but in the same manner as shown in FIG. 5C) and then be taken back to the Plan Organizer tab 220 of FIG. 8.

Figure 8:
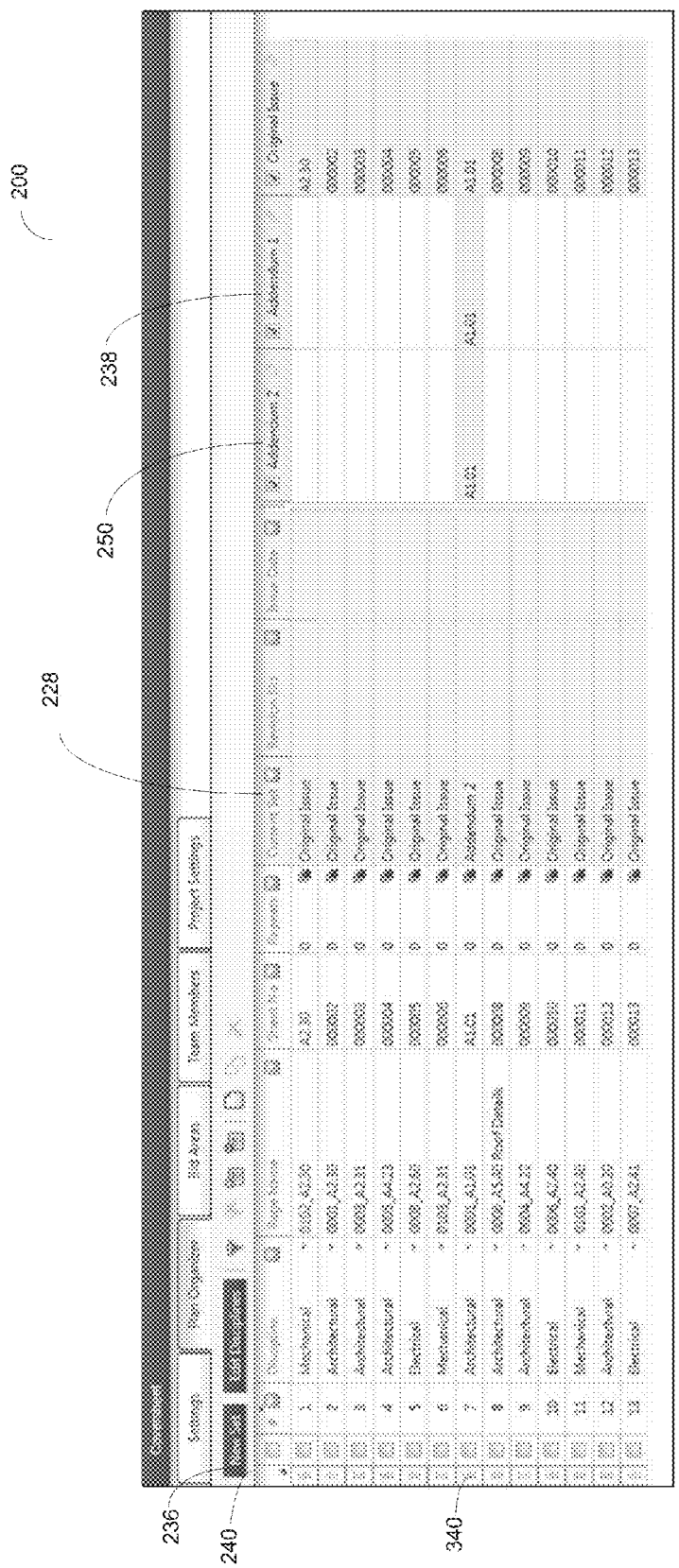
FIG. 8 is a diagram illustrating an exemplary user interface screen showing a list of uploaded drawings, according to one embodiment.

As illustrated in FIG. 8, each time a new set of drawings is added to a project, a new column listing the new set is added to the table 240. Thus, table 240 includes a new column 250 labeled "Addendum 2" for the new set of drawings added. Table 240 also shows the two previously added drawing sets "Original Issue" and "Addendum 1." Because the drawing that was added in "Addendum 2" set has the same Sheet Number as drawing A1.01 of the "Original set" and the "Addendum 1" set, the new drawing is displayed in table 240 in the same row as the drawing A1.01. The Current Set column 228 then displays Addendum 2 as the set which contains the latest version of this drawing. Thus, as more sets are added, the program continues to match newly added drawings with previously stored drawings and to organize and display the new sets and the relationships between the various drawings on one screen in the Plan Organizer.

Figure 9:
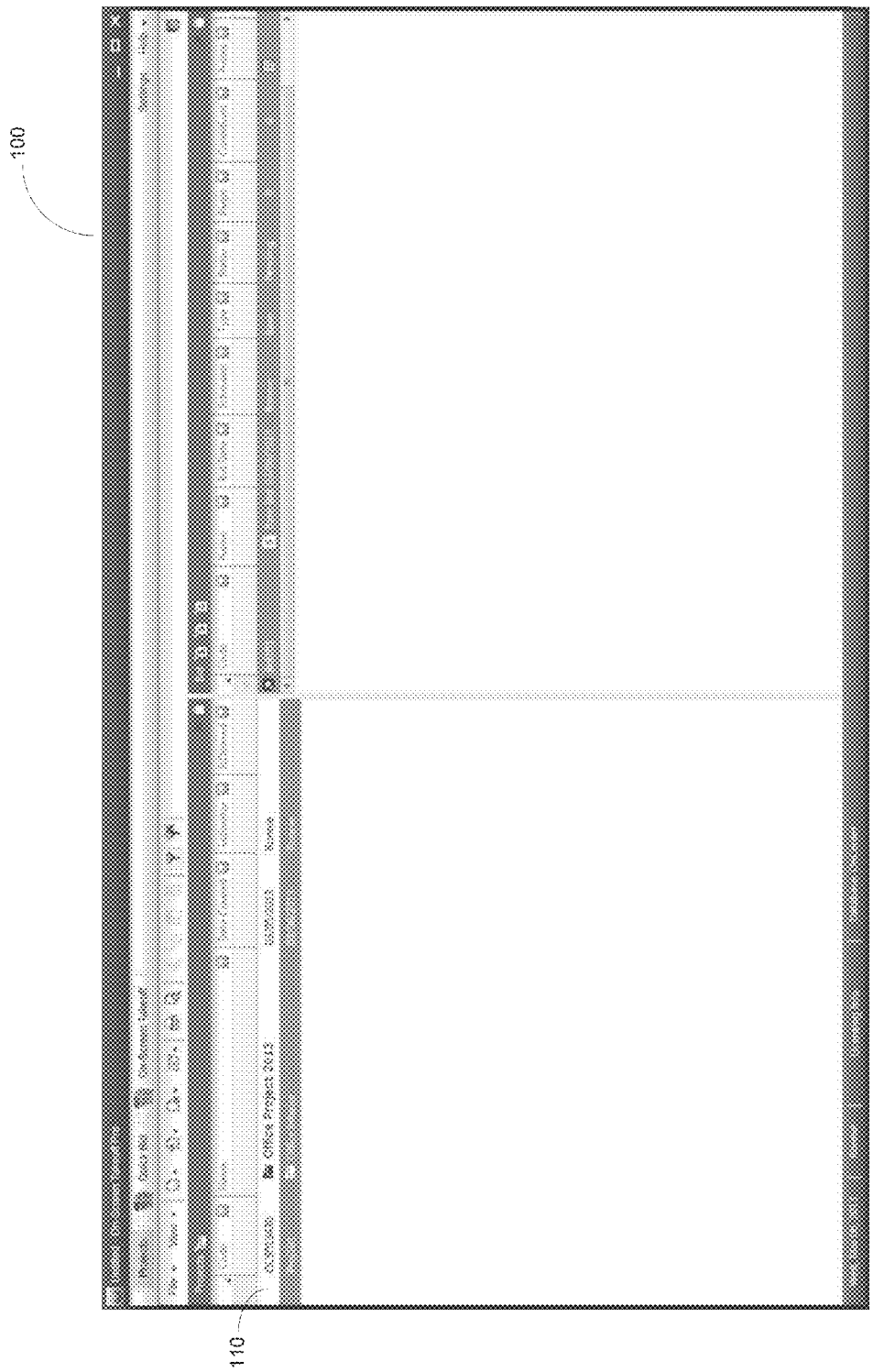
FIG. 9 is a diagram illustrating an exemplary user interface screen for a construction software program which includes a new project, according to one embodiment.
Figure 10A:
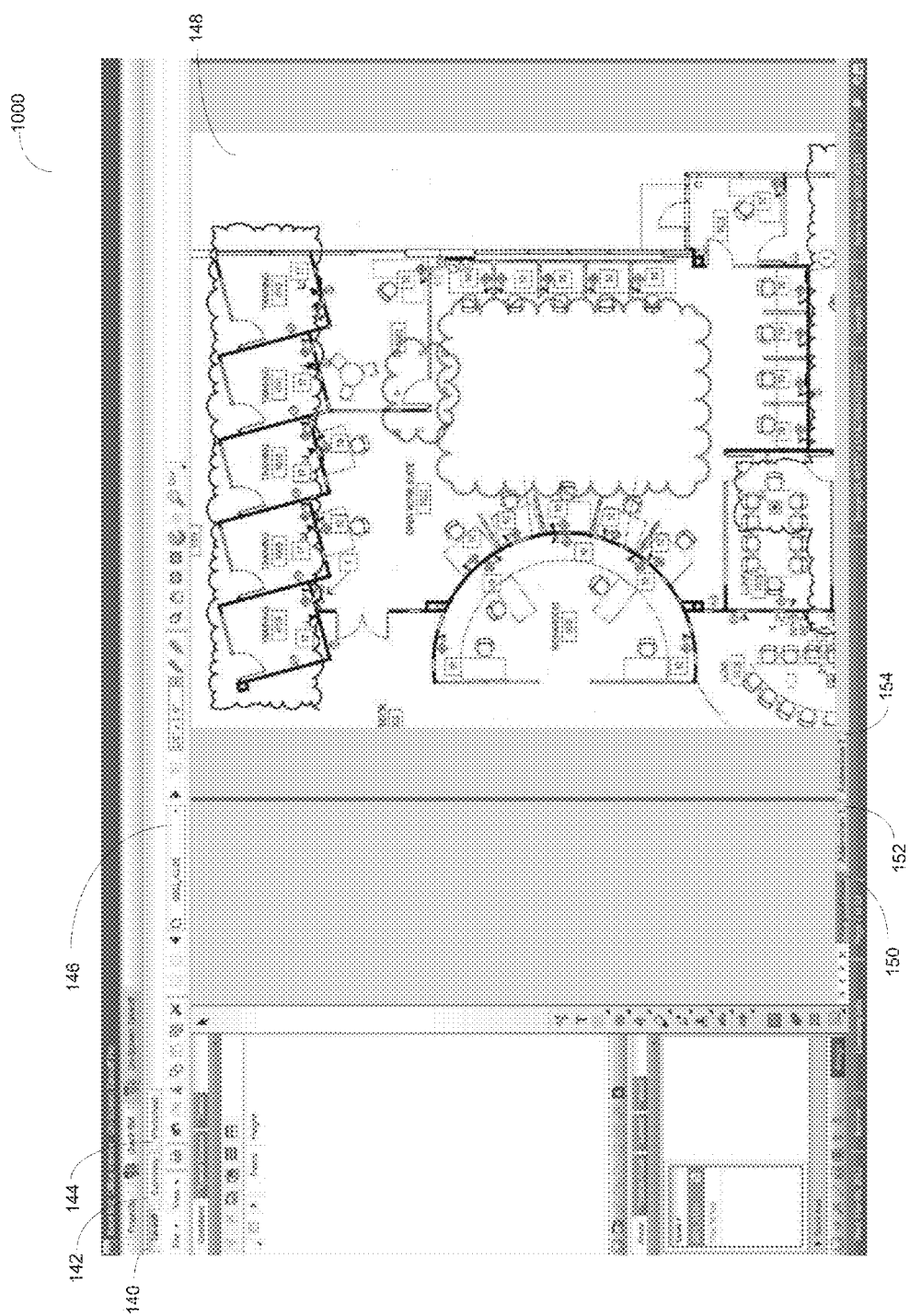
FIGS. 10A-10C are diagrams illustrating displays of drawings uploaded for the project, according to one embodiment.

Once all sets of drawings have been added for a project, the user can go back to the original program screen 100 as illustrated in FIG. 9. The screen 100 now displays the newly added "Office Interior" as one of the projects in the view pane no. At this point, selecting Office Interior and clicking on On-Screen Takeoff takes the user to the On-Screen Takeoff portion of the software program where the user can perform a takeoff for the project. FIG. 10A illustrates an exemplary Takeoff screen 1000. The takeoff process involves counting or quantifying all building conditions for the project and is performed by estimators in construction projects to determine an estimated cost for the project.

The user interface screen woo includes several buttons, tabs and drop down menus that provide a variety of options for viewing and processing of construction related information. For example, the screen woo includes a tab 140 for performing and viewing quantity takeoffs, a tab 142 for a Summary and a tab 144 for viewing an estimating Worksheet. A dropdown menu 146 includes a list of all the drawings uploaded to the program for the project. The dropdown menu 146 thus allows the user to select which drawing of the construction project to view. When a drawing is selected from the dropdown menu 146, the image screen 148 provides a view of the selected drawing. The dropdown menu 146 of FIG. 10A shows that the drawing "0001_A1.01" has been selected. The drawing "0001_A1.01" corresponds to the drawing 340 of FIG. 8 for which three different drawing versions from three different sets exist. As a result, when the drawing "0001_A1.01" is selected, the screen woo includes three different tabs 150, 152, and 154 below the image screen 148. The tab 150 is named "Original Issue" which corresponds to the name of the first set containing the drawing "000_A1.01." When tab 150 is selected, the program displays the drawing that corresponds to the drawing "000_A1.01" from the Original Issue set of the drawings. The tab 152 is named "Addendum 1" which corresponds with the second set containing a drawing with the same Sheet Number as the drawing "0001_A1.01". The tab 154, in turn, is named "Addendum 2" which corresponds with the third set containing a drawing with the same Sheet Number as the drawing "000_A1.01". Because the drawings from the three different sets were matched during the uploading process, the program recognizes that the drawing "000_A1.01" has two corresponding drawings from two other sets. Accordingly, when one of the drawings belonging to the matching group is selected for viewing, the program displays tabs for the other drawing sets containing the matching drawings.

Figure 10B:
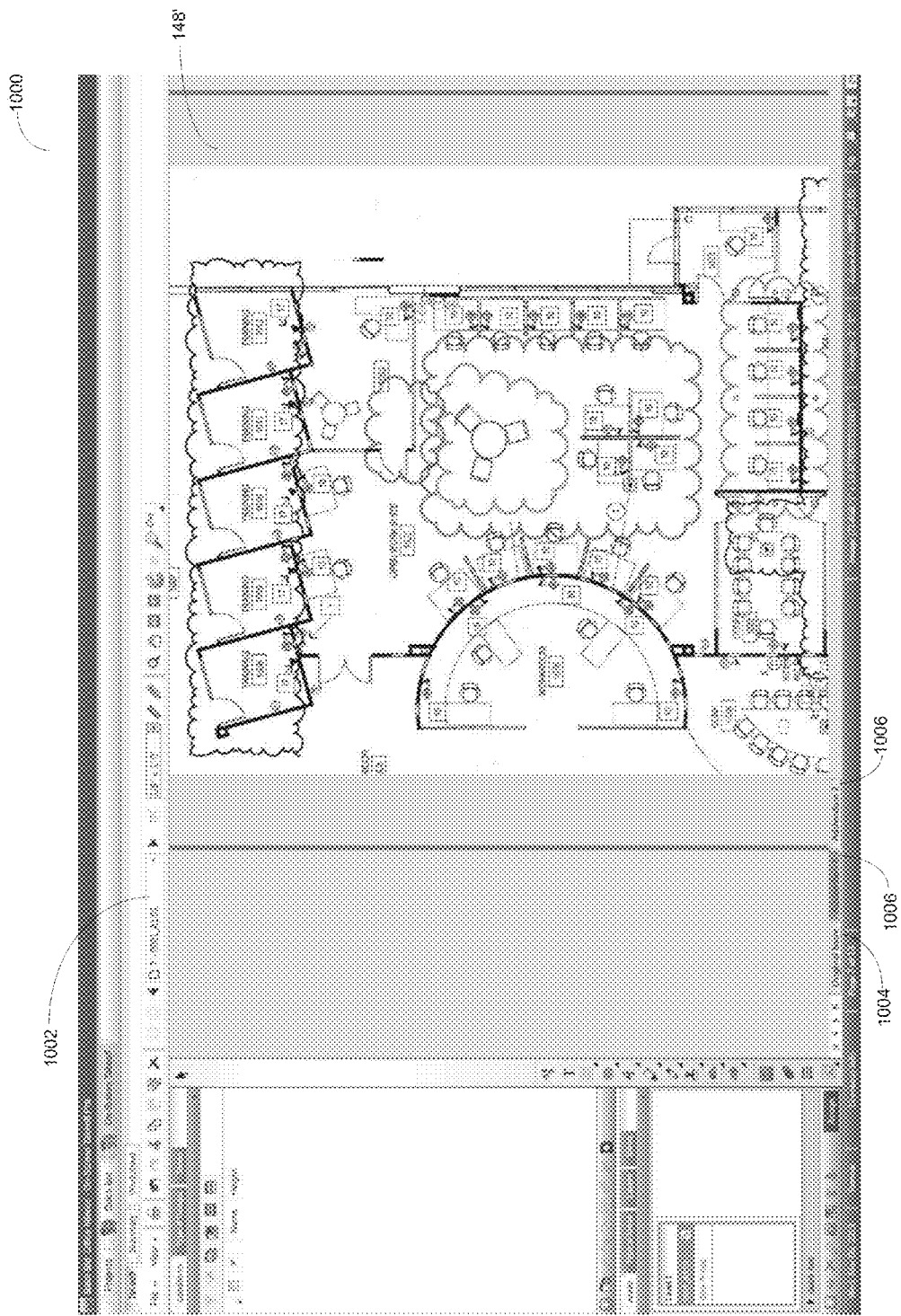
Figure 10C:
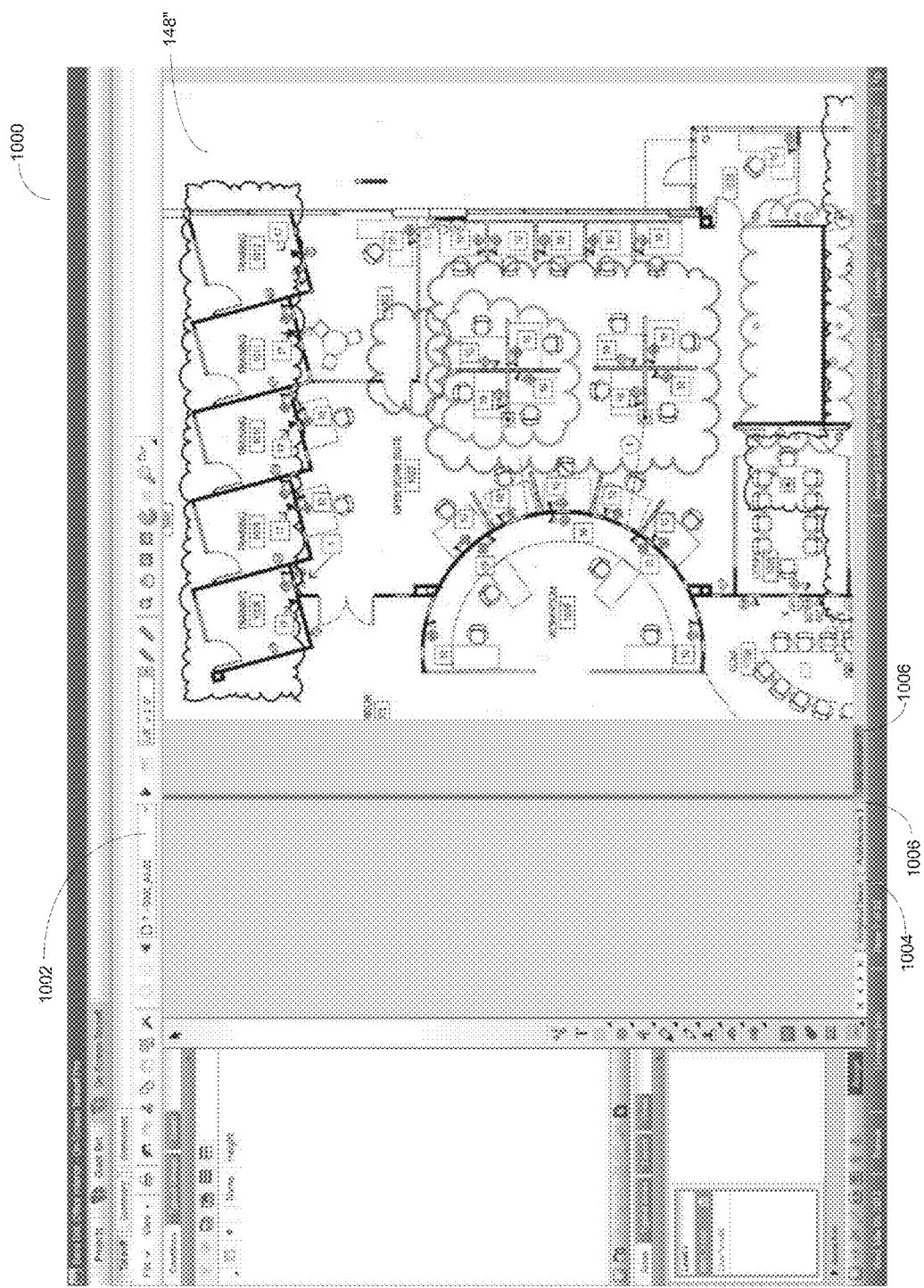

Clicking on the tab 152 causes the program to display the Addendum 1 drawing corresponding with the drawing "0001_A1.01". This is illustrated in FIG. 10B. As can be seen from a comparison of the image screens 148 and 148', the Addendum 1 drawing is a revised version of the drawing "000_A1.01" from the Original Issue set. The same is true for the Addendum 2 drawing displayed in the image screens 148" of FIG. 10C.

Thus, when selecting a drawing for viewing, On-Screen Takeoff or other processing, the preferred embodiment of the present invention enables the user to immediately recognize if there are multiple versions of the drawing, and to access those versions all from the same screen. This not only eliminates the need for a construction professional to manually keep track of various changes in the project, it also enables the user to click through the various drawing tabs and easily assess the differences between them. This system of collating and managing drawings significantly increases efficiency and accuracy of the bidding and management of construction projects and saves time for construction professionals.

It should be noted that the two dimensional images shown and discussed in this specification can also be three dimensional (3D) such as a 3D CAD drawing, Building Information Model (BIM), or the like. A 3D drawing is advantageous in that the user can view each of the various building areas in a manner that is closer to the actual shape and design of the buildings and can examine each object easier. Some 3D models also include objects that have built-in associated quantities.

As would be known to a person of ordinary skill in the art, the software program of the preferred embodiment of the present invention is generally stored in memory in a computer device and is run by a processor inside that computer. This processor can be located in a computer in an office, in a local or remote server, or in a network cloud. Other configurations are also possible.

It is to be understood that the above description is intended to be illustrative, and not restrictive. For example, it is understood that the term clicking is used as an exemplary method of selecting an object or an area. All other methods of selecting an object or area on a screen are contemplated, e.g., tapping, and the like. The above-described embodiments may also be used in combination with each other. Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A computer-implemented method for organizing drawings associated with a construction project, the method comprising:

in response to selection of a first set of drawings from a user input device, obtaining the first set of drawings;

dynamically displaying a table with information about each of the obtained first set of drawings, wherein the table includes a plurality of rows and a plurality of columns, wherein each row of the plurality of rows corresponds to a drawing of the first set of drawings, wherein each column of the plurality of columns corresponds to a field of a plurality of fields, and wherein dynamically displaying the table comprises:

determining an organization scheme by which the first set of drawings are organized, displaying the plurality of fields for the table based on the organization scheme, wherein each field relates to one category of information about the drawings and the table displays a list of entries under each field, wherein each list of entries comprises the category of information related to the field for one or more of the obtained first set of drawings, wherein each entry in each list corresponds to a drawing of the first set of drawings, and wherein a first one of the fields corresponds to sheet numbers assigned based on the organization scheme, wherein a second one of the fields corresponds to a current set indicator providing information identifying a set of drawings to which a latest version of each drawing belongs, wherein a third one of the fields corresponds to the first set of drawings, and wherein the third field is different from the first field, determining a sheet number for each of the first set of drawings, determining a current set indicator for each of the first set of drawings, automatically populating the sheet number and current set indicator fields for each of the first set of drawings in the table, and automatically populating the third one of the fields with the sheet number for each of the first set of drawings;

in response to a plurality of additional selections of a plurality of additional sets of drawings by the user input device, obtaining the plurality of additional sets of drawings, wherein the plurality of additional sets of drawings are obtained subsequent to obtaining the first set of drawings, and wherein each additional set of drawings, of the plurality of additional sets of drawings, is different from the first set of drawings;

automatically displaying a plurality of additional fields for the table, wherein each additional field corresponds to an additional set of drawings of the plurality of additional sets of drawings;

automatically populating each additional field with the sheet number for each of the corresponding additional sets of drawings;

identifying a particular drawing in a particular additional set of drawings, of the plurality of additional sets of drawings, that corresponds to a same drawing in the first set of drawings by comparing the list of entries for one or more of the fields in the first set of drawings to the list of entries for the same one or more fields in the particular additional set of drawings;

automatically modifying a particular entry, corresponding to the particular drawing, in the list of entries under the current set indicator field to indicate that the particular drawing in the particular additional set of drawings corresponds to a latest version associated with the same drawing of the first set of drawings;

displaying the table on a display device, wherein the table provides indications for correspondences between drawings in the first set and drawings in the plurality of additional sets.

2. The method of claim 1, wherein the sheet number is identified in a page name for each drawing.

3. The method of claim 1, further comprising:
comparing the sheet number field of the drawings in the first set of drawings to the sheet number field of the drawings in the particular additional set of drawings.

4. The method of claim 3, wherein comparing the list for one or more of the fields in the first set to the list for the same one or more fields in the particular additional set comprises determining if a sheet number field of one of the drawings in the particular additional set matches a sheet number field of one of the drawings in the first set.

5. The method of claim 1, wherein one of the plurality of the fields comprises a discipline field.

6. The method of claim 5, further comprising:
determining a discipline for entries in the discipline field from a name of a subfolder from which the drawing was obtained.

7. The method of claim 1, further comprising:
providing a user an ability to review the table and modify one or more entries in the table for the fields associated with the drawings.

8. The method of claim 1, further comprising:
providing a preview of at least one drawing in the table when the drawing is selected.

9. The method of claim 8, further comprising:
presenting, on the display device, a user interface to enable a user to verify the sheet number for the at least one drawing based on the preview.

10. The method of claim 1, further comprising:
providing an option for viewing the drawings, wherein when a drawing from one set is selected to be viewed, if the selected drawing has a corresponding drawing from another set, the correspondence is presented with a display of the selected drawing.

11. The method of claim 1, wherein the entries in the list under current set indicator field include a name of the latest set of drawings to which each drawing belongs.

12. A non-transitory computer medium comprising sequences of instructions, which when executed by a processor, cause the processor to:
in response to selection of a first set of drawings from a user input device, obtain the first set of drawings;
dynamically display a table with information about each of the first set of drawings, wherein the table includes a plurality of rows and a plurality of columns, wherein each row of the plurality of rows corresponds to a drawing of the first set of drawings, and wherein each column of the plurality of columns corresponds to a field of a plurality of fields, the dynamically displaying the table comprising:
determining an organization scheme by which the first set of drawings are organized,
displaying the plurality of fields for the table, wherein each field relates to one category of information about the drawings and the table displays a list of entries under each field, wherein each list of entries comprises the category of information related to the field for one or more of the obtained first set of drawings, wherein each entry in each list corresponds to a drawing of the first set of drawings, and wherein a first one of the fields corresponds to sheet numbers assigned based on the organization scheme, a second one of the fields provides information identifying a set of drawings to which a latest version of each drawing belongs, wherein a third one of the fields corresponds to the first set of drawings, and wherein the third field is different from the first field, determining a sheet number for each of the first set of drawings, determining a latest version for each of the first set of drawings, automatically populating the first field with the sheet number and the second field with the latest version for each of the first set of drawings in the table, and automatically populating the third field with the sheet number for each of the first set of drawings;

in response to a plurality of additional selections of a plurality of additional sets of drawings by the user input device, obtain the plurality of additional sets of drawings, wherein the plurality of additional sets of drawings are obtained subsequent to obtaining the first set of drawings, and wherein each additional set of drawings, of the plurality of additional sets of drawings, is different from the first set of drawings;

automatically display a plurality of additional fields for the table, wherein each additional field corresponds to an additional set of drawings of the plurality of additional sets of drawings;

automatically populate each additional field with the sheet number for each of the plurality of additional sets of drawings;

compare the list of entries for one or more of the fields in the first set of drawings to the list of entries for the same one or more fields in a particular additional set of drawings, of the plurality of additional sets of drawings, to identify a particular drawing in the particular additional set of drawings that corresponds to a same drawing in the first set of drawings;

automatically modify a particular entry, corresponding to the particular drawing, in the list of entries under the second field to indicate that the particular drawing in the particular additional set of drawings corresponds to a latest version associated with the same drawing of the first set of drawings; and display the table on a display device, wherein the table provides indications for correspondences between drawings in the first set of drawings and drawings in the plurality of additional sets of drawings.

13. The non-transitory computer medium of claim 12, wherein the sheet number is identified in a page name for each drawing.

14. The non-transitory computer medium of claim 12, wherein the instructions further cause the processor to:
compare the sheet number field of the drawing in the first set of drawings to the sheet number field of the drawings in the particular additional set of drawings.

15. The non-transitory computer medium of claim 14, wherein comparing the list for one or more of the fields in the first set to the list for the same one or more fields in the particular additional set of drawings comprises determining if a sheet number field of one of the drawings in the particular different set of drawings matches a sheet number field of one of the drawings in the first set of drawings.

16. The non-transitory computer medium of claim 12, wherein one of the plurality of the fields comprises a discipline field.

17. The non-transitory computer medium of claim 16, wherein the instructions further cause the processor to:
determine a discipline for each drawing from a name of a subfolder from which the drawing was obtained.

18. The non-transitory computer medium of claim 12, wherein the instructions further cause the processor to:
provide a user an ability to review the table and modify one or more entries in the table for the fields associated with the drawings.

19. The non-transitory computer medium of claim 12, wherein the instructions further cause the processor to:
provide a preview of at least one drawing in the table when the drawing is selected.

20. The non-transitory computer medium of claim 19, wherein the instructions further cause the processor to:
provide, on the display device, a user interface to enable a user to verify the sheet number for the at least one drawing base on the preview.

21. The non-transitory computer medium of claim 12, wherein the instructions further cause the processor to:
provide an option for viewing the drawings, wherein when a drawing from one set is selected to be viewed, if the selected drawing has a corresponding drawing from another set, the correspondence is presented with a display of the selected drawing.

22. The non-transitory computer medium of claim 12, wherein the entries in the list under second field include a name of the latest set of drawings to which each drawing belongs.

* * * * *

UNITED STATES PATENT AND TRADEMARK OFFICE
CERTIFICATE OF CORRECTION

| | |
|---|---|
| PATENT NO. | : 10,296,665 B2 |
| APPLICATION NO. | : 13/833329 |
| DATED | : May 21, 2019 |
| INVENTOR(S) | : Leonard Buzz et al. |

Page 1 of 1

It is certified that error appears in the above-identified patent and that said Letters Patent is hereby corrected as shown below:

In the Claims

Column 12, Claim 20, Line 36, should read:
drawing based on the preview.

Signed and Sealed this
Third Day of September, 2019

Andrei Iancu
*Director of the United States Patent and Trademark Office*